(12) United States Patent
Oggioni et al.

(10) Patent No.: US 6,710,258 B2
(45) Date of Patent: Mar. 23, 2004

(54) CIRCUITIZED SUBSTRATE FOR HIGH-FREQUENCY APPLICATIONS

(75) Inventors: Stefano Oggioni, Milan (IT); Roberto Ravanelli, Milan (IT)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/125,624

(22) Filed: Apr. 18, 2002

(65) Prior Publication Data

US 2002/0180004 A1 Dec. 5, 2002

(30) Foreign Application Priority Data

Apr. 25, 2001 (GB) .............................................. 0110072

(51) Int. Cl.[7] .................................................. H05K 1/03
(52) U.S. Cl. ........................ 174/255; 174/264; 174/266; 174/260; 361/794; 361/795
(58) Field of Search ................................. 174/255, 260, 174/262–266; 361/792–795

(56) References Cited

U.S. PATENT DOCUMENTS

| 5,363,280 | A | * | 11/1994 | Chobot et al. ............... 361/794 |
| 5,451,720 | A | * | 9/1995 | Estes et al. .................. 174/250 |
| 5,473,813 | A | * | 12/1995 | Chobot et al. ................ 29/837 |
| 5,538,433 | A | * | 7/1996 | Arisaka ........................ 439/70 |
| 5,590,030 | A | * | 12/1996 | Kametani et al. ........... 361/794 |
| 5,929,375 | A |   | 7/1999 | Glovatsky et al. ............. 174/35 |
| 6,052,287 | A | * | 4/2000 | Palmer et al. ............... 361/767 |
| 6,235,994 | B1 | * | 5/2001 | Chamberlin et al. ........ 174/252 |

FOREIGN PATENT DOCUMENTS

| EP | 0 180 183 A2 | 5/1986 | ............ H05K/3/46 |
| JP | 5036859 A2 | 2/1993 | ........... H01L/23/12 |

* cited by examiner

*Primary Examiner*—Kamand Cuneo
*Assistant Examiner*—Jose H. Alcala
(74) *Attorney, Agent, or Firm*—William N. Hogg

(57) ABSTRACT

A multi-layered circuitized substrate for high-frequency applications. Conductive via-holes extend between two non-adjacent conductive layers for transmitting high-frequency signals therebetween. For each via-hole, shielding rings connectable to a reference voltage are provided, each ring formed in a corresponding intermediate conductive layer between the two non-adjacent conductive layers. The rings define a shielding coaxial structure for the via-hole. Preferably, the intermediate conductive layers are spaced apart from the via-hole, and particularly from respective lands at the ends thereof, in order to reduce stray capacitance associated with the via-hole without losing the shielding effect provided by the rings.

11 Claims, 6 Drawing Sheets

CIRCUITIZED SUBSTRATE FOR HIGH-FREQUENCY APPLICATIONS

FIELD OF INVENTION

The present invention relates to a circuitized substrate, and particularly to such a substrate designed especially for high-frequency applications.

BACKGROUND OF THE INVENTION

Circuitized substrates comprised of an insulating material provided with conductive tracks defining an electric circuit, are commonly used in several electronic assemblies. For example, a circuitized substrate may be used as a chip carrier for protecting an electronic circuit integrated in a chip of semiconductor material from mechanical stresses, the chip being electrically coupled to the carrier. Moreover, a circuitized substrate may also be used as a Printed Circuit Board (PCB) for having multiple electronic modules and components mounted thereon, including the aforementioned chip carrier.

In some applications, the circuitized substrate has a multi-layer structure, with a plurality of conductive layers (tracks) insulated from each other and via-holes used to connect the conductive layers electrically where necessary. The transmission of an electric signal on the corresponding tracks and via-holes generates an electromagnetic wave which propagates along a transmission line defined by a dielectric material surrounding the tracks and the via-holes. When the electronic assembly embedding the circuitized substrate works at a high frequency (for example higher than 1 GHz), the propagation of this wave (microwave) may be adversely affected by the performance of the electronic assembly as a whole. Particularly, a discontinuity (or transition) in the transmission line, such as a change in structure, material properties and/or design features, may generate a reflected wave. Moreover, the electronic assembly includes stray structures (capacitors, inductors and resistors), which may act as low pass filters for the transmitted signal. As a consequence, the integrity of the electromagnetic wave propagated along the transmission line may be affected. For example, a signal switching between a low voltage (logic value 0) and a high voltage (logic value 1) is generated as a square-shaped wave by a driver unit; because of the discontinuities and stray structures associated with the transmission line, the signal is generally received as a pseudo-sinusoidal wave by a different unit.

The quality of the transmission can be visualized by a so-called "eye diagram", which plots the value of the received signal as a function of the phase of a clock signal controlling the switching of the transmitted signal. The above described discontinuities and stray structures associated with the transmission line may reduce the opening of the eye diagram; therefore, it is quite difficult to understand if a switching transition has actually taken place or if the shift of a signal baseline is due to a background noise. Moreover, the received signal features a slow ramp for each switching transition of the transmitted signal. It is then possible that the received signal remains at a stable value for a brief time, even shorter than a settling time needed for recognizing the switching transition. As a consequence, the switching transition may not be correctly distinguished from a sudden noise pulse (spike).

These drawbacks are particular acute in modern electronic assemblies working with a reduced level of a power supply voltage (down to 1.2 V). In this case, there is a very low margin to discriminate between the logic value 0 (0V) and the logic value 1 (1.2V).

Therefore, the low quality of the transmission forces the electronic assembly to operate at a frequency far lower than the working frequency that is affordable by an active component of the electronic assembly (such as the electronic circuit integrated in the chip).

It is believed, therefore, that a circuitized substrate which overcomes the above disadvantages would constitute a significant advancement in the art.

OBJECTS AND SUMMARY OF THE INVENTION

It is, therefore, a primary object of this invention to enhance the circuitized substrate art.

It is another object of the invention to provide a circuitized substrate which overcomes the disadvantages of known substrates such as discussed above.

It is yet another object of the invention to provide a circuitized substrate which can be expeditiously produced, thus assuring a relatively low cost for same.

According to one aspect of the invention, there is provided a circuitized substrate comprising a plurality of electrically conductive layers, selected ones of the electrically conductive layers electrically insulated from adjacent ones of the electrically conductive layers by dielectric material, at least one electrically conductive via-hole extending between and electrically coupling two non-adjacent ones of the electrically conductive layers and adapted for transmitting a high frequency signal therebetween, at least one of the electrically conductive layers being an intermediate conductive layer positioned between the two non-adjacent ones of the electrically conductive layers and including at least one shielding track connectable to a reference voltage, the shielding track substantially surrounding the at least one electrically conductive via-hole.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals may be used to indicate like elements from FIG. to FIG.

Figure 1:
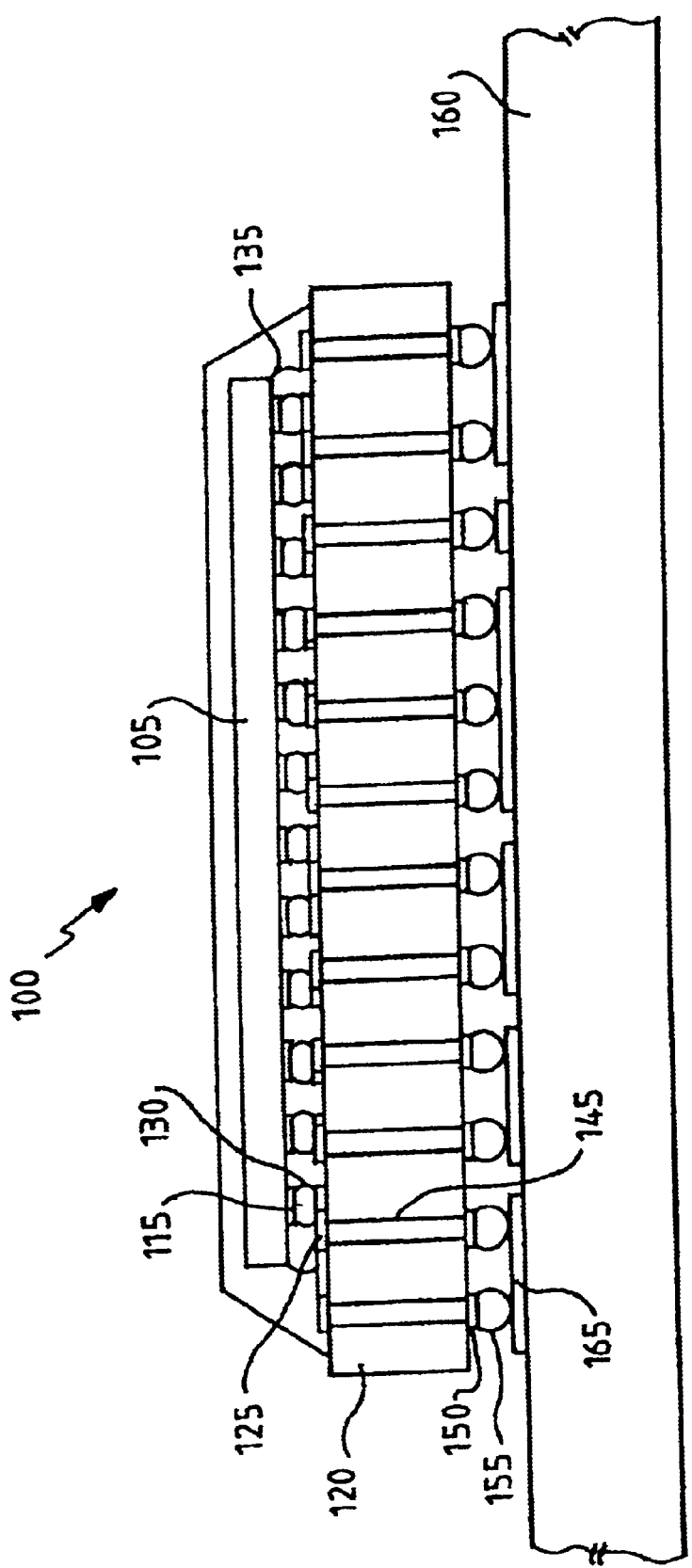
FIG. 1 is a side elevational view, in section, of an electronic module in which the circuitized substrate of the invention can be used.

With reference in particular to FIG. 1, there is shown an electronic module 100 of the CSP (Chip Scale Package)

type. Electronic module 100 includes a chip 105 of semiconductor material, wherein a power circuit workable at high frequency (for example with a clock rate of 10 GHz) is integrated. Chip 105 is supplied by a low voltage power supply (for example of 1.2V relative to a reference voltage, or ground). Several contact terminals 115 are formed through a dielectric layer that protects an active surface of chip 105.

Chip 105 is mounted on a chip carrier 120 comprised of an insulating circuitized substrate. The chip mounting is preferably accomplished using a flip-chip technique, wherein the active surface of chip 105 (including contact terminals 115) faces an upper surface of the chip carrier 120, as shown. Particularly, contact pads 125 on the carrier's upper surface corresponding to contact terminals 115 each project through a solder mask that protects the upper surface of chip carrier 120. Contact terminals 115 are soldered to contact pads 125 by means of respective solder bumps 130, which thus connect chip 105 to carrier 120 both mechanically and electrically.

An under-filling material 135 (such as an epoxy resin) is interposed between chip 105 and carrier 120. Under-filling material 135 improves the mechanical connection between chip 105 and carrier 120 (compensating for different coefficients of thermal expansion in these materials), and also protects chip 105 and the formed electrical connections with chip carrier 120 from the external environment.

Contact pads 125 are connected to plated through holes (or via-holes) 145, either by means of conductive tracks formed on the upper surface of chip carrier 120 or directly (in this case, contact pads 125 are generally referred to as lands). Via-holes 145 are in turn connected to further lands 150 formed on a lower surface of chip carrier 120. Interconnecting solder balls 155 (made of a eutectic solder, such as a Tin Lead alloy) are positioned on respective lands 150.

Electronic module 100 is typically mounted on a printed circuit board (PCB) 160 by soldering interconnecting balls 155 onto corresponding conductive tracks 165. Typically, multiple electronic modules and components (such as discrete resistors and capacitors) are mounted on printed circuit board 160. The assembly formed by printed circuit board 160 and the electronic modules and components mounted thereon is commonly referred to as an electronic board (or PCB) assembly. Electronic module 100 may have a different structure than illustrated herein; for example, if it is of the BGA (Ball Grid Array) type, the chip may be mounted on the carrier with its active surface turned upward which is wire-bonded to the carrier; the chip may not utilize a (digital) power circuit; the chip may work at a different frequency or with a different power supply; etc.

Figure 2A:
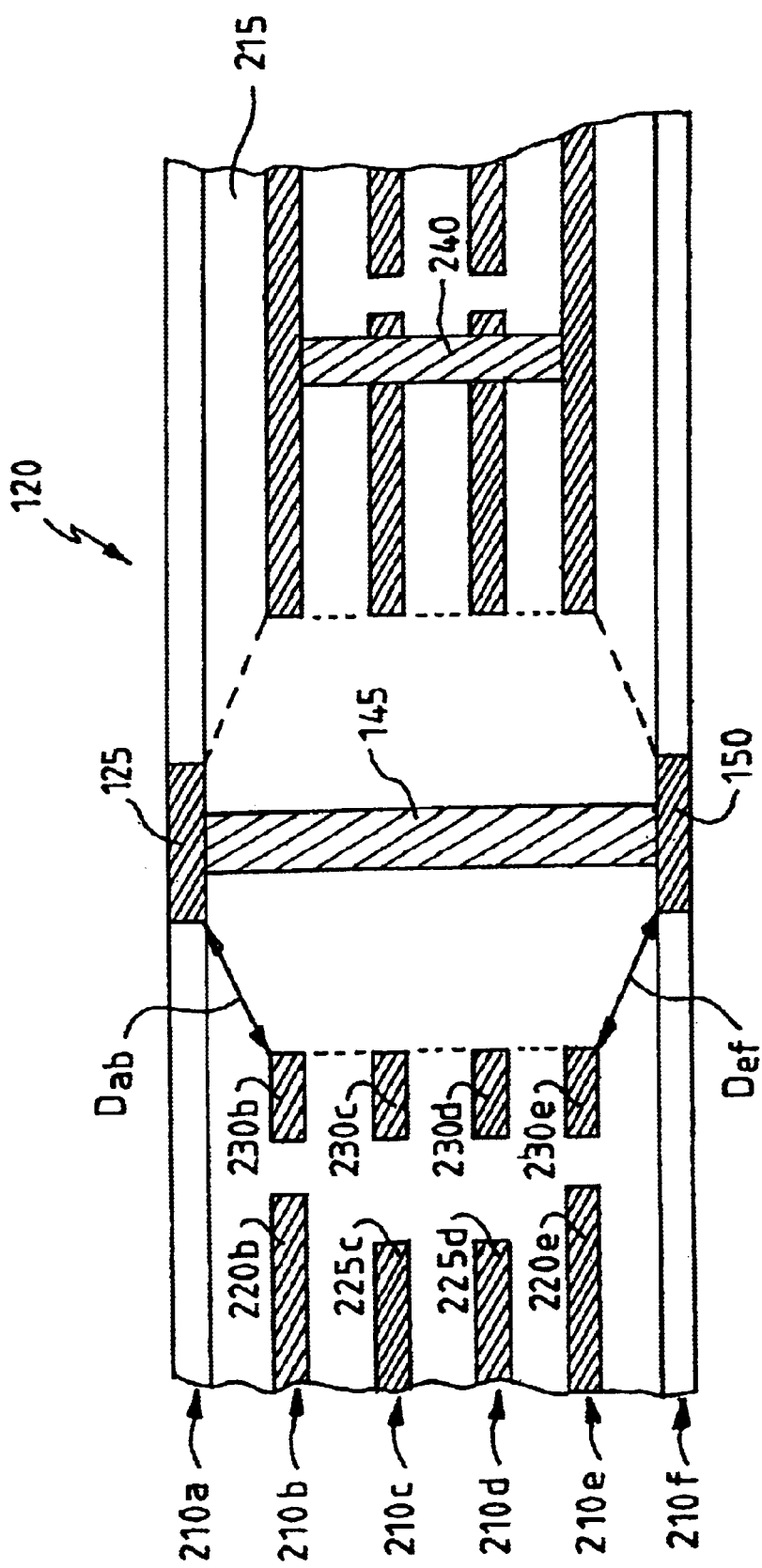
FIGS. 2a and 2b depict a particular embodiment of the circuitized substrate of the invention, in a side elevational view (in section), and in an exploded three-dimensional view thereof, respectively.

Considering now FIG. 2a, chip carrier 120 has a multi-layer structure, with several conductive layers insulated from each other. In the example at issue, chip carrier 120 includes six conductive layers 210a, 210b, 210c, 210d, 210e and 210f (made, for example, of copper), which are insulated from each other by layers of dielectric material 215 (made, for example, of an epoxy resin with glass fibers). The dielectric layers arranged between each couple of adjacent conductive layers 210a–210f each may have a thickness of about 110 mm.

Land 125 is formed in the first conductive layer 210a (starting from the upper surface of chip carrier 120), while land 150 is formed in the last (or bottom) conductive layer 210f. Land 125, via-hole 145 and land 150 are used to transmit a high-frequency signal between the chip (coupled to the upper surface of chip carrier 120) and the printed circuit board (coupled to the lower surface of chip carrier 120).

Ground plane 220b is formed in the second conductive layer 210b (adjacent to first conductive layer 210a), and another ground plane 220e is formed in conductive layer 210e (adjacent to last conductive layer 210f). Ground planes 220b and 220e feature a couple of coaxial openings for each via-hole 145. One or more further via-holes (not shown in FIG. 2a) are used to connect ground planes 220b and 220e to the reference voltage. Multiple signal tracks 225c and 225d are formed in conductive layers 210c and 210d, respectively.

The high-frequency signal transmitted between the chip and the printed circuit board generates an electromagnetic wave. The electromagnetic wave propagates along a transmission line defined by land 125, via-hole 145 and land 150, and a reference structure formed by ground planes 220b and 220e. Ground planes 220b and 220e control impedance of the transmission line (typically tailored to a value of 50 Ω) and shield the same from electromagnetic interference.

The inventors have discovered that degradation in performance of some electronic modules is mainly due to a discontinuity of the transmission line associated with via-hole 145. Moreover, via-hole 145 generates stray capacitors that have a relative high capacitance (of the order of 500 fF). Particularly, stray capacitors are formed between land 125 and underlying ground plane 220b, and between land 150 and the underlying ground plane 220e; further stray capacitors are formed by the coupling of via-hole 145 with the intermediate (inner) conductive layers 210b–210e interposed between conductive layers 210a and 210f.

Figure 2B:
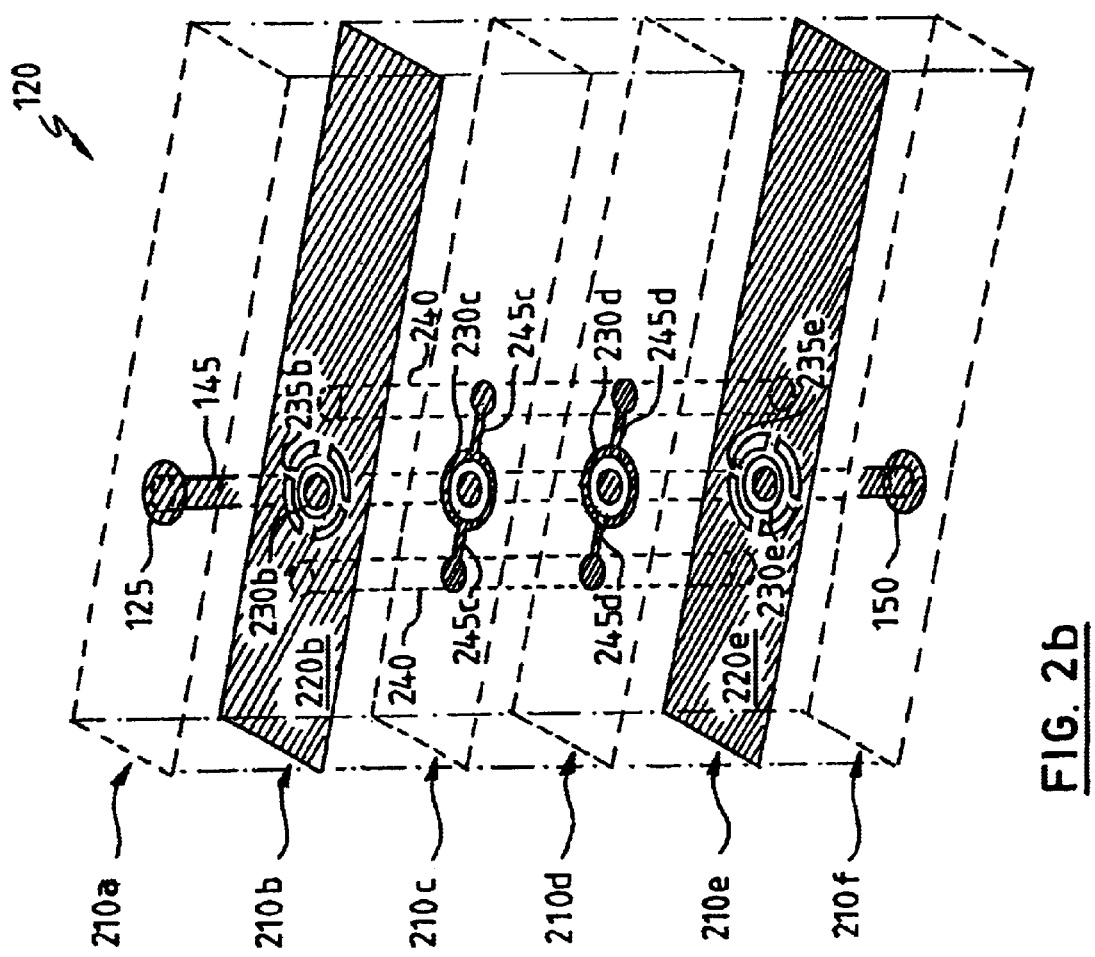

In a preferred embodiment of the present invention, as shown in the exploded view of FIG. 2b, inner conductive layers 210b, 210c, 210d and 210e include a shielding ring 230b, 230c, 230d and 230e, respectively. Each ring 230b–230e is formed by a circular track (for example with a width of 100 mm), which is closed around via-hole 145. Particularly, via-hole 145 is arranged at a center of each ring 230b–230e (without interposition of any other conductive element). Rings 230b and 230e are formed by removing four arc-shaped portions of ground planes 220b and 220e. In this way, rings 230b and 230e are connected to a remaining portion of ground planes 220b and 220e through four radial conductive segments 235b and 235e in each respective plane. Two via-holes 240 (opposed to via-hole 145) extend between ground planes 220b and 220e. Conductive segments 245c and 245d connect rings 230c and 230d, respectively, to via-holes 240 (and then to the reference voltage). One via-hole 240 is seen in FIG. 2a.

Referring back to FIG. 2a, rings 230b–230e are arranged outside lands 125 and 150 in plan view. Particularly, a distance Dab between an internal border of ring 230b and an external border of land 125 and a distance Def between an internal border of ring 230e and an external border of land 150 are inversely proportional to a wavelength of the signal transmitted along elements 125, 145 and 150 according to a factor having a value from $1 \times 10^{-6}$ and $10 \times 10^{-6}$. Preferably, this factor has a value about $4 \times 10^{-6}$ to about $5 \times 10^{-6}$, such as about $4.2 \times 10^{-6}$. In the example at issue, wherein the signal has a frequency f=10 GHz (assuming that the dielectric material has a dielectric constant $\epsilon_r=3.75$ and a diamagnetic constant $\mu=1$), the distance Dab,Def is:

$$Dab, Def = \frac{4.2 \times 10^{-6}}{\lambda} = \frac{4.2 \times 10^{-6} \times f \times \sqrt{\epsilon_r \times \mu}}{c} =$$

-continued $$\frac{4.2 \times 10^{-6} \times 10 \times 10^{9} \times \sqrt{3.75 \times 1}}{2.998 \cdot \times 10^{8}} = 271 \times 10^{-6} = 271 \ \mu m$$

The other rings 230c and 230d are arranged in plan view outside a clearance window defined orthographically projecting the internal border of rings 230b and 230e on the planes of corresponding conductive layers 210c and –210d.

The above considerations apply if the chip carrier has a different structure, for example, it includes additional via-holes and/or a different number of conductive layers. Also, if the dielectric material has a different thickness, if the ground planes are replaced by equivalent shielding structures (for example, comprised of two or more tracks), if couples of coplanar shielding tracks are provided on the upper surface of the chip carrier, if the rings have a different width, and so on, these considerations are equally applicable.

More generally, the present invention provides a circuitized substrate for high-frequency applications including a plurality of conductive layers insulated from each other and one or more via-holes extending between two non-adjacent conductive layers for transmitting a high-frequency signal. One or more intermediate conductive layers are interposed between the two non-adjacent conductive layers. The circuitized substrate further includes, for each via-hole, one or more shielding tracks connectable to a reference voltage. Each shielding track is formed in a corresponding intermediate conductive layer and substantially surrounds the via-hole. The devised solution thus provides a mesh shielding of the via-hole, which acts as a coaxial structure.

The solution of the invention optimizes the propagation of the electromagnetic wave through the transition associated with the via-hole, and maintains good integrity of the electromagnetic wave along the transmission line. The proposed design of the circuitized substrate thus affects the performance of an active component associated therewith (such as the electronic circuit integrated in the chip) as little as possible.

The devised structure does not require any substantial change in the manufacturing process of the circuitized substrate, so that these results are achieved at relatively little, if any, extra cost. The preferred embodiment of the invention described above offers further advantages. Particularly, the rings closed around the via-hole provide a complete shielding path. Moreover, the arrangement of the via-hole at the centre of the rings ensures that no asymmetry is introduced. Preferably, the rings are formed in each inner conductive layer, so that these rings are as close as possible to each other (given the pre-set thickness of the dielectric layer arranged between them). This results in a very low pitch of the mesh structure around the via-hole, which provides a good shielding for signals with a very high frequency. Experimental results have shown that the mesh structure achieves a reasonable shielding of signals with a wavelength $\lambda_{max}$ up to four times the pitch of the mesh up structure. In the example at issue, wherein the dielectric layer has a thickness of 110 mm (with a dielectric constant $\epsilon_r$=3.75 and a diamagnetic constant $\mu$=1), the mesh structure is effective to shield signals with a frequency $f_{max}$ up to:

$$f_{max} =$$

-continued $$\frac{c}{\lambda_{max} \times \sqrt{\varepsilon_r \times \mu}} = \frac{2.998 \times 10^{8}}{4 \times 110 \times 10^{-6} \times \sqrt{3.75 \times 1}} = 352 \times 10^{9} = 352 \ GHz$$

Alternatively, it is not necessary that the rings are completely closed around the via-hole. Further, the rings may be comprised of square or other polygonal shape frames rather than cylindrical as shown, and the rings may not be formed in all the inner conductive layers (for example with a ring every two or more conductive layers).

The solution of the invention is particularly advantageous when the via-hole is a plated though hole extending between the first and the last conductive layer (with multiple inner layers arranged between them), as shown in FIGS. 2a and 2b. Moreover, the particular solution devised for connecting the rings to the reference voltage (with the conductive segments for reaching the remaining part of the ground planes or the further via-holes extending between the ground planes) is particularly effective and does not interfere with the shielding provided by the mesh. Preferably, the further via-holes (i.e., 240) are symmetrically arranged around the transmission line via-hole (145 in FIGS. 2a and 2b), in order to keep the structure as balanced as possible.

The solution of the invention lends itself to implementation even in a circuitized substrate with a reduced number of conductive layers (down to three), with transmission line via-holes extending only between internal layers, with a different number of conductive segments for each ring, with only a single added via hole, and with the rings connected to the reference voltage in a different manner.

The rings spaced apart from the transmitting via-hole (and particularly from the respective lands) strongly reduce stray capacitance between the lands and the ground planes, and between the via-hole and the inner conductive layers (being inversely proportional to their distance). In the example at issue, the arrangement of the rings outside the lands in plan view reduces the capacitance of the aforementioned capacitors down to 10–20 fF. Moreover, experimental results have shown that the values proposed for the distance between the rings and the lands provide the best performance of the electronic module. The arrangement of the inner conductive layers outside the clearance window further improves the performance of the electronic module at high frequency. The proposed structure ensures a good reduction of stray capacitances without losing the shielding effect provided by the rings. It should be noted that this result is obtained with a negligible waste of area on the chip carrier, since only few via-holes are typically used for transmitting high-frequency signals (for example less than 10% of all the via-holes included in the chip carrier).

Preferably, the circuitized substrate of the invention is used as a carrier for a circuit integrated in a chip of semiconductor material. The advantageous effects provided by the solution taught herein greatly improve the performance of the corresponding electronic module. Particularly, this allows the electronic module to be operated at a frequency very close to the working frequency afforded by the chip. However, as stated, the circuitized substrate according to the present invention lends itself for use as a PCB or in other electronic assemblies.

Figure 3:
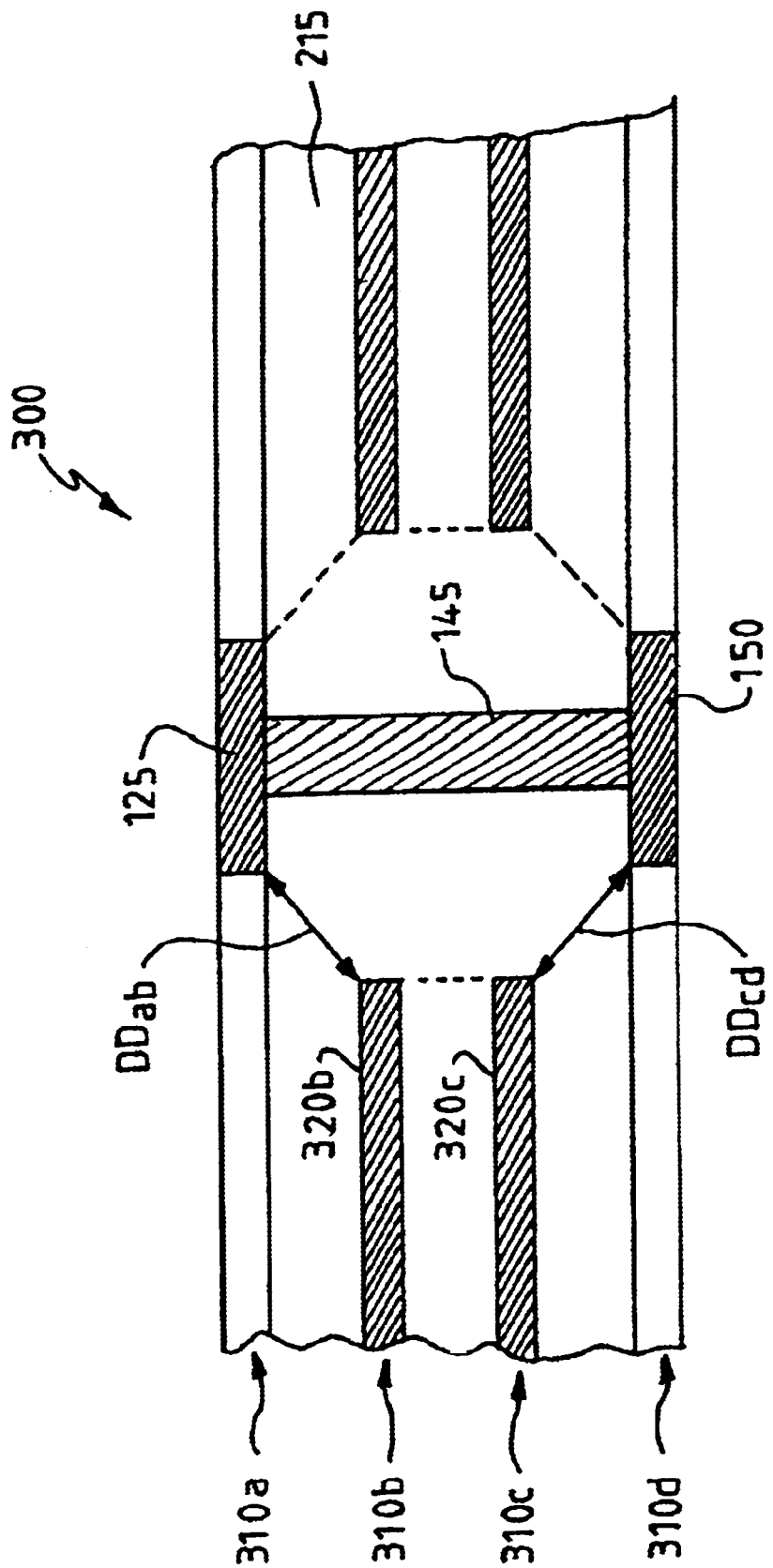
FIG. 3 is a side elevational view, in section, of a different embodiment of the invention.

With reference in particular to FIG. 3 (the elements corresponding to the ones shown in FIG. 2a are denoted with the same numerals, and explanation thereof is omitted for the sake of simplicity), there is shown a chip carrier 300 according to an alternative embodiment of the invention.

Chip carrier 300 includes four conductive layers 310a, 310b, 310c and 310d, which are insulated from each other by means of dielectric material 215. Land 125 is formed in first conductive layer 310a (starting from the upper surface of chip carrier 300), while land 150 is formed in last (or bottom) conductive layer 310d. Layers 310a–d and 215, and contact pads/lands 125 and 150 and via hole 145 are preferably of the same materials as the counterparts in FIG. 2a.

Ground plane 320b is formed in second conductive layer 310b (adjacent first conductive layer 310a), and a power plane 320c is formed in the third conductive layer 310c (adjacent the last conductive layer 310d). Ground plane 320b and power plane 320c define a pair of coaxial openings for via-hole 145. One or more further via-holes (not shown in the FIG. 3) are used to connect ground plane 320b and power plane 320c to the reference voltage and to the power supply voltage, respectively, similarly as further via-hole 240 does so in FIG. 2a.

Ground plane 320b and power plane 320c are arranged outside lands 125 and 150 in plan view. Particularly, a distance DDab between a border of ground plane 320b (that is an internal border of the opening for via-hole 145) and an outer border of land 125 is inversely proportional to a wavelength $\lambda$ of the signal transmitted along elements 125, 145 and 150. More specifically, the distance DDab is (inversely) proportional to the wavelength $\lambda$ according to a factor having a value from about $1 \times 10^{-6}$ and $10 \times 10^{-6}$. Preferably, this factor has a value from about $4 \times 10^{-6}$ to about $5 \times 10^{-6}$, such as about $4.2 \times 10^{-6}$. In a similar manner, a distance DDcd between a border of power plane 320c (that is an internal border of the opening for via-hole 145) and an outer border of lower land 150 is inversely proportional to the wavelength X of the signal according to the same factor.

These considerations apply if the chip carrier has a different structure, if the chip carrier includes a different number of conductive layers (for example with two ground planes and one or more signal tracks arranged between them), if the ground plane and the power plane are replaced by equivalent structures (for example comprised of two or more tracks), if the distance between the ground/power planes and the lands is determined in a different manner, if the proposed arrangement is applied only to one out of the ground plane and the power plane, and so on.

More generally, the present invention further provides a circuitized substrate for high-frequency applications including a plurality of conductive layers insulated from each other. One or more via-holes for transmitting a high-frequency signal extend from a first conductive layer provided on a main surface of the circuitized substrate and end with a contact area formed on the bottom conductive layer. The insulated substrate further includes a shielding structure for the first conductive layer connectable to a reference voltage and formed in a second conductive layer adjacent to the first conductive layer. The shielding structure is arranged outside the contact area in plan view; a distance between the shielding structure and the contact area is inversely proportional to a wavelength of the high-frequency signal according to a factor having a value from about $1 \times 10^{-6}$ to about $10 \times 10^{-6}$.

The proposed arrangement of the ground/power planes strongly reduces stray capacitance associated with the via-hole (and particularly with the respective lands). This result is obtained with a solution that is in sharp contrast to the common practice of keeping the ground/power planes (or more generally any reference structure) as close as possible to the via-hole. Conversely, the inventors have discovered that the devised structure provides the best performance of the electronic module, since it ensures a good reduction of stray capacitances without losing the shielding effect provided by the ground/power planes. As explained above, this solution does not affect the dimension of the chip carrier, since only few via-holes are typically used for transmitting high-frequency signals.

Figure 4A:
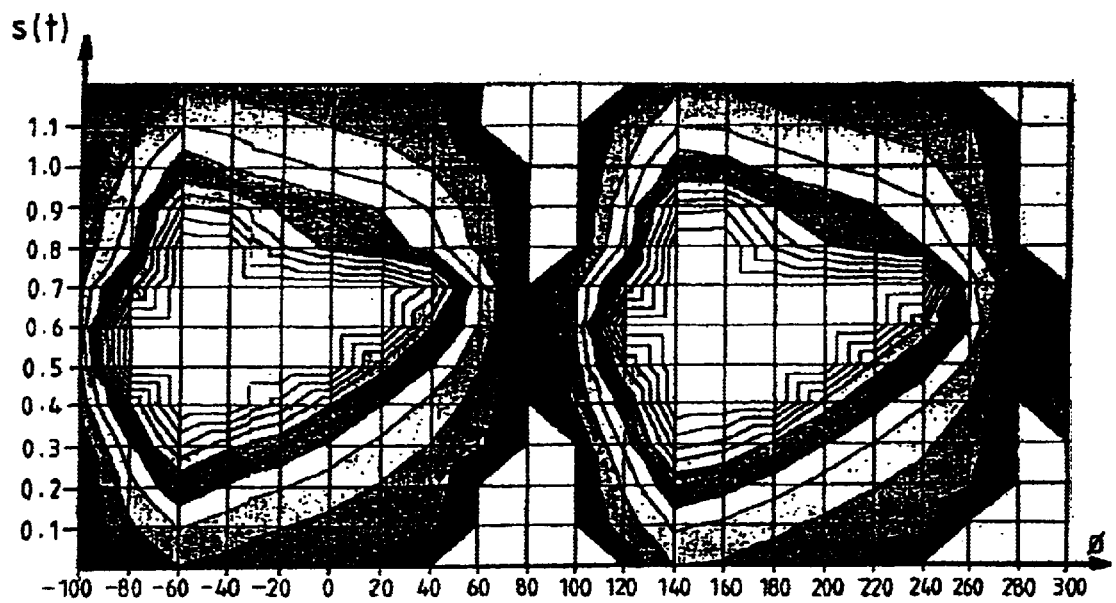
FIGS. 4a and 4b show "eye-diagrams" of a signal in a known electronic module and in an electronic module including the circuitized substrate of the present invention, respectively.

Both of the aforedefined embodiments of the present invention strongly improve the performance of the electronic module including the chip carrier. With reference in particular to FIG. 4a, there is depicted an eye-diagram for a known electronic module. This diagram shows the value (in V) of a signal s(t) received from a transmission line as a function of the phase ($\phi$) of a clock signal. The eye-diagram is quite close, due to the discontinuities and stray capacitors associated with the transmission line.

Figure 4B:
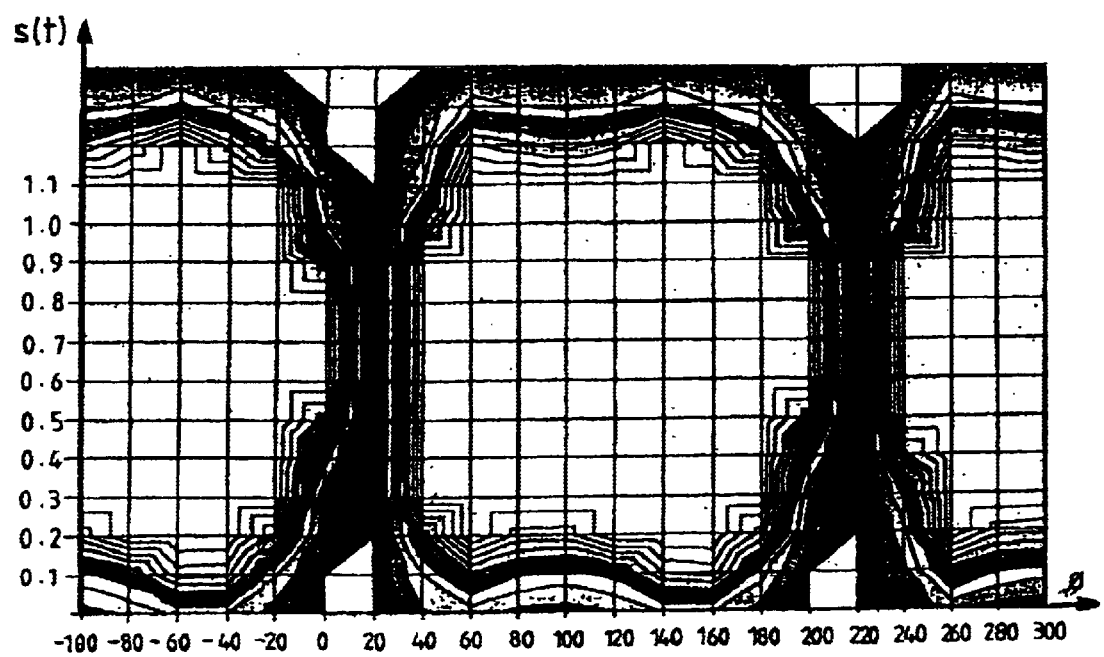

Conversely, an eye-diagram for the electronic module embedding the chip carrier of the invention, as shown in FIG. 4b, is more open, so that it is easier to discriminate an actual switching transition of the signal from a spike or from a shift of a signal baseline due to background noise. As a consequence, the electronic module can be operated at a high frequency even with a reduced level of power supply voltage.

Figure 5A:
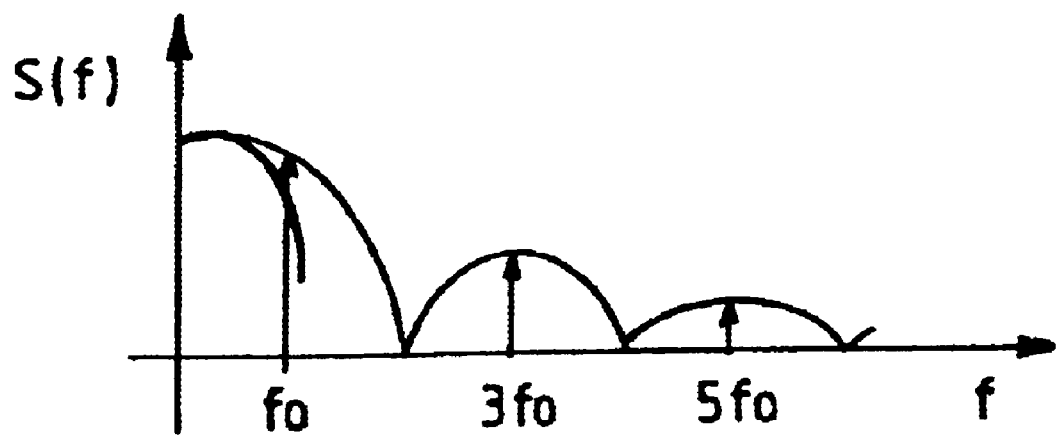
FIGS. 5a and 5b depict the same signals in the frequency domain, respectively.
Figure 5B:
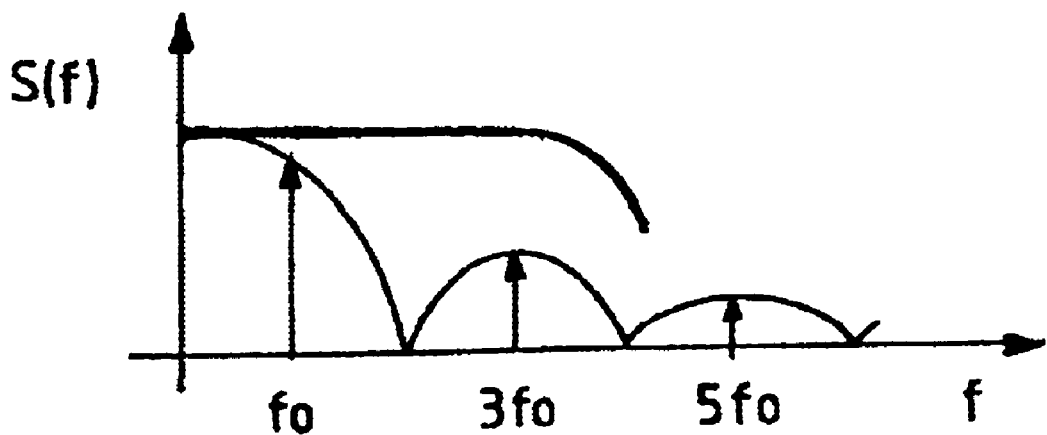

In other words, in the known electronic module the low-pass filter defined by the stray capacitors formed between the lands and the ground/power planes and between the inner conductive layers and the via-hole has a very low cut-off frequency; therefore, as shown in FIG. 5a, only the first harmonic f0 of the signal s(f) expressed in the frequency domain (f) is hardly transmitted. On the other hand, the solution of the invention increases the bandwidth of the transmission line up to the third harmonic 3f0 of the signal, as shown in FIG. 5b.

Naturally, in order to satisfy local and specific requirements, a person skilled in the art may apply to the solution described above many modifications and alterations all of which, however, are included within the scope of protection of the invention as defined by the following claims.

What is claimed is:

1. A circuitized substrate comprising:

a plurality of electrically conductive layers, selected ones of said electrically conductive layers electrically insulated from adjacent ones of said electrically conductive layers by dielectric material;

at least one electrically conductive via-hole extending between and electrically coupling two non-adjacent ones of said electrically conductive layers through lands associated with each non-adjacent electrically conductive layer, and configured and arranged to transmit a high frequency signal therebetween;

at least one of said electrically conductive layers being an intermediate conductive layer positioned between said two non-adjacent ones of said electrically conductive layers and including at least one shielding track having structure connectable to a reference voltage, said shielding track substantially surrounding and insulated from said at least one electrically conductive via-hole.

2. The circuitized substrate of claim 1 wherein said at least one shielding track includes a closed ring, said electrically conductive via-hole being substantially centrally positioned within said ring.

3. The circuitized substrate of claim 1 wherein the number of said intermediate conductive layers is greater than one, each of said intermediate conductive layers including at least one of said shielding tracks connectable to said reference voltage.

4. The circuitized substrate of claim 3 wherein two of said intermediate conductive layers are positioned adjacent one another.

5. The circuitized substrate of claim 3 further including a further electrically conductive via-hole electrically coupling two of said intermediate conductive layers.

6. The circuitized substrate of claim 5 including a plurality of said further electrically conductive via-holes, said plurality being positioned within said substrate adjacent said conductive via-hole extending between and electrically coupling said two non-adjacent ones of said electrically conductive layers.

7. The circuitized substrate of claim 1 wherein each of said two non-adjacent ones of said electrically conductive layers is located on an opposing exterior surface of said circuitized substrate.

8. The invention of claim 7 further including a semiconductor chip element electrically coupled to one of said two non-adjacent ones of said electrically conductive layers, said invention comprising a high-frequency electronic module.

9. The invention of claim 8 wherein the other of said non-adjacent ones of said electrically conductive layers is configured and arranged for being electrically coupled to a printed circuit board.

10. The circuitized substrate of claim 1 wherein said electrically conductive layers are comprised of copper.

11. The circuitized substrate of claim 1 wherein said dielectric material is comprised of epoxy resin having glass fibers.

* * * * *